(12) United States Patent
Miyazaki

(10) Patent No.: US 8,422,239 B2
(45) Date of Patent: Apr. 16, 2013

(54) DISPLAY DEVICE

(75) Inventor: Hiroyuki Miyazaki, Mutsuzawa (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 290 days.

(21) Appl. No.: 12/772,393

(22) Filed: May 3, 2010

(65) Prior Publication Data

US 2011/0007481 A1  Jan. 13, 2011

(30) Foreign Application Priority Data

Jul. 13, 2009 (JP) ................................. 2009-164571

(51) Int. Cl.
*H05K 1/00* (2006.01)

(52) U.S. Cl.
USPC ............................ 361/749; 349/150; 174/254

(58) Field of Classification Search .................. 361/681, 361/649, 770; 349/149–150
See application file for complete search history.

(56) References Cited

U.S. PATENT DOCUMENTS

| | | | |
|---|---|---|---|
| 6,342,932 B1 | 1/2002 | Terao | |
| 6,398,560 B1 * | 6/2002 | Mizuno | 439/67 |
| 6,828,721 B2 | 12/2004 | Wakita | |
| 7,471,353 B2 | 12/2008 | Oohira | |
| 2002/0125815 A1 * | 9/2002 | Wakita | 313/491 |
| 2008/0055834 A1 * | 3/2008 | Matsuzaki et al. | 361/681 |

FOREIGN PATENT DOCUMENTS

| | | |
|---|---|---|
| JP | 6-258623 | 9/1994 |
| JP | 2000-147544 | 5/2000 |
| JP | 2001-109390 | 4/2001 |
| JP | 2002-328623 | 11/2002 |
| JP | 2003-066483 | 5/2003 |
| JP | 2007-121615 | 5/2007 |
| JP | 2007-279591 | 10/2007 |

* cited by examiner

*Primary Examiner* — Tuan T Dinh
*Assistant Examiner* — Mukund G Patel
(74) *Attorney, Agent, or Firm* — Antonelli, Terry, Stout & Kraus, LLP.

(57) ABSTRACT

A display device includes a display panel, a case that has a middle frame disposed around the display panel and a lower frame disposed on the display panel on the opposite side from a display face, a circuit board that has a circuit for performing display control of the display panel, a flexible wiring board at least a part of which is disposed between the lower frame of the case and the circuit board for electrically connecting the display panel with the circuit board, and a connector that is mounted on the circuit board on the opposite side from the flexible wiring board for electrically connecting to the outside, wherein the flexible wiring board has holes, and the circuit board is fixed to the lower frame via the holes of the flexible wiring board.

21 Claims, 5 Drawing Sheets

DISPLAY DEVICE

CROSS-REFERENCE TO RELATED APPLICATION

The present application claims priority from Japanese application JP 2009-164571 filed on Jul. 13, 2009, the content of which is hereby incorporated by reference into this application.

BACKGROUND OF THE INVENTION

1. Field of the Invention

The present invention relates to a display device.

2. Description of the Related Art

In a display device having a display panel such as a liquid crystal display panel, a circuit board for driving display is disposed on a rear face (opposite side from a display face) of the display device. Please refer to JP-A-2003-66483 and JP-A-2007-121615 (corresponding to U.S. Pat. No. 7,471,353). The circuit board and the display panel are electrically connected to each other by a flexible wiring board. Specifically, the flexible wiring board is attached at one end thereof to the display panel, is attached at the other end to the circuit board, and is turned back so as to turn around the display panel from an end thereof to the rear side thereof.

SUMMARY OF THE INVENTION

In a conventional structure, when the circuit board and the flexible wiring board are disposed on the rear face of the display device, the circuit board and the flexible wiring board are disposed so as not to overlap with each other. Therefore, a certain degree of space is required for the rear face of the display device. In a display device with a small screen size, therefore, there is a problem in that a space for disposing the circuit board and the flexible wiring board cannot be assured on the rear face of the display device.

Moreover, since the circuit board and the flexible wiring board are disposed in a limited space so as not to overlap with each other, the layout design for disposing them is subjected to restraints. Further, since a connector for electrically connecting to an external device is mounted on the circuit board, the circuit board and the flexible wiring board cannot be overlapped with each other such that the flexible wiring board covers the connector.

It is an object of the invention to dispose a circuit board on which a connector is mounted and a flexible wiring board in a small space.

A display device according to the invention is, for example, as follows.

(1) A display device according to the invention includes: a display panel; a lower frame disposed on the display panel on the opposite side from a display face; a circuit board disposed on a face of the lower frame on the opposite side from the display panel; and a flexible wiring board connected to the display panel, wherein the flexible wiring board is turned back from the display panel side to the face of the lower frame on the opposite side from the display panel, at least a part of the flexible wiring board being disposed between the lower frame and the circuit board, the flexible wiring board has holes, and the circuit board is fixed to the lower frame via the holes of the flexible wiring board. According to the invention, since the circuit board and the flexible wiring board are overlapped with each other, the circuit board on which a connector is mounted and the flexible wiring board can be disposed in a small space.

(2) In the display device according to (1), the lower frame may have convex portions protruding toward the circuit board, the convex portions may be inserted into the holes of the flexible wiring board to support the circuit board, and the circuit board may be fixed to the lower frame by the convex portions.

(3) In the display device according to (1), the lower frame may have a first convex portion and a second convex portion protruding toward the circuit board, the first convex portion and the second convex portion may be inserted into the holes of the flexible wiring board to support the circuit board, and the circuit board may be fixed to the lower frame by the first convex portion but not fixed thereto by the second convex portion.

(4) In the display device according to (2), the height of the convex portion may be greater than the thickness of the flexible wiring board, and a gap may be formed at least one of between the circuit board and the flexible wiring board and between the lower frame and the flexible wiring board.

(5) In the display device according to (3), the height of the first convex portion and the height of the second convex portion may be both greater than the thickness of the flexible wiring board, and a gap may be formed at least one of between the circuit board and the flexible wiring board and between the lower frame and the flexible wiring board.

(6) In the display device according to any one of (1) to (5), a connector may be mounted on a face of the circuit board on the opposite side from the flexible wiring board, and the circuit board may be fixed to the lower frame at a position between a mounting position of the connector and an end of the circuit board closest to the connector mounting position.

(7) In the display device according to any one of (1) to (5), a connector may be mounted on a face of the circuit board on the opposite side from the flexible wiring board, and at least a part of the flexible wiring board may be disposed between the connector and the lower frame.

(8) In the display device according to (7), the connector may have a connecting port, the connecting port may face a predetermined direction, and the predetermined direction may be a direction from a mounting position of the connector toward a portion where the flexible wiring board is turned back.

(9) In the display device according to any one of (1) to (5), a first connector and a second connector may be mounted on a face of the circuit board on the opposite side from the flexible wiring board, the first connector may have a connecting port, and the flexible wiring board and the circuit board may be connected to each other by the second connector while avoiding the front of the connecting port of the first connector.

DESCRIPTION OF THE PREFERRED EMBODIMENTS

Hereinafter, an embodiment of the invention will be described with reference to the drawings.

Figure 1:
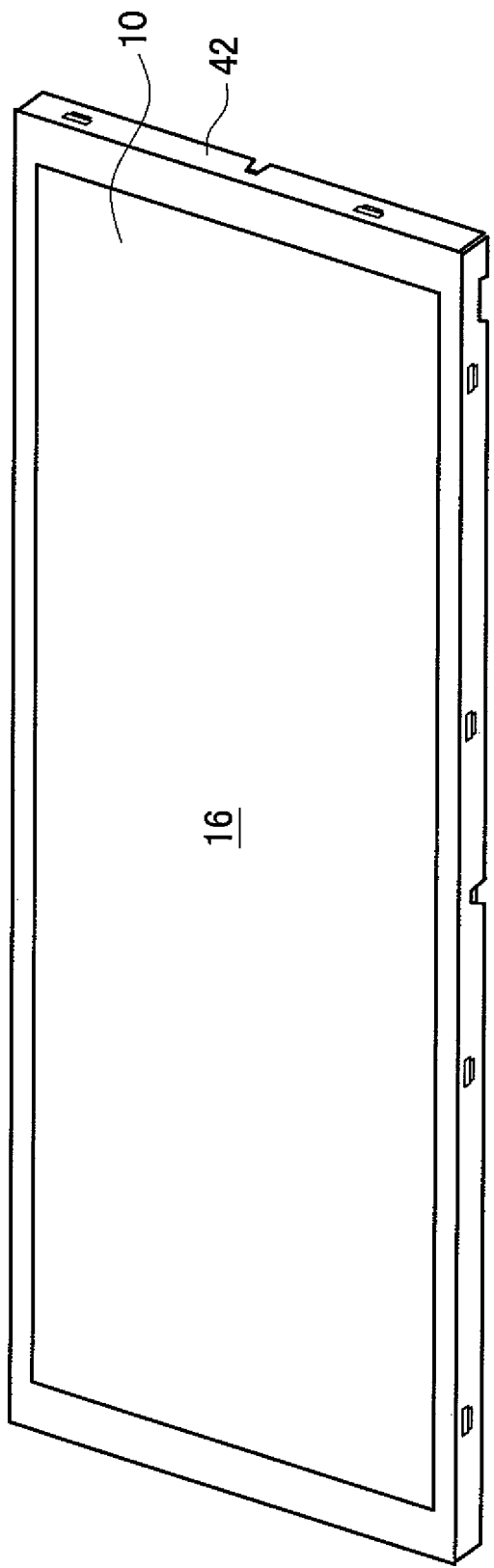
FIG. 1 is a front side perspective view of a display device according to an embodiment of the invention.
Figure 2:
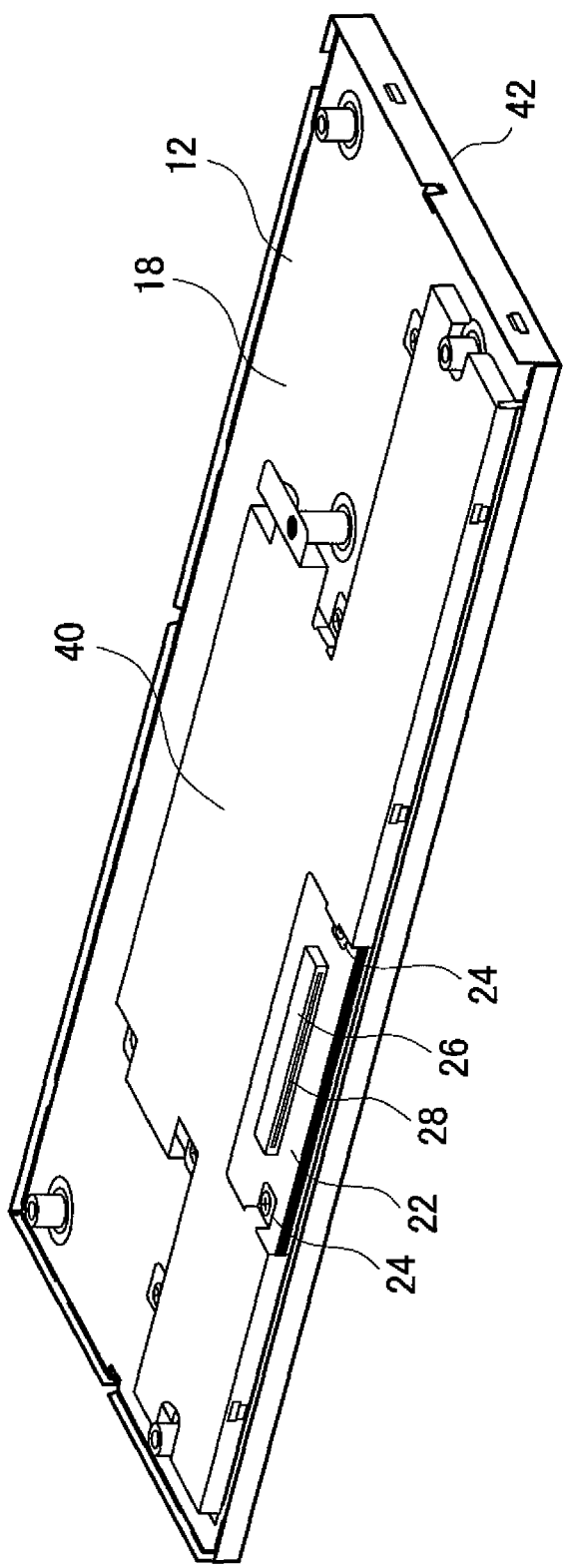
FIG. 2 is a rear side perspective view of the display device according to the embodiment of the invention.
Figure 3:
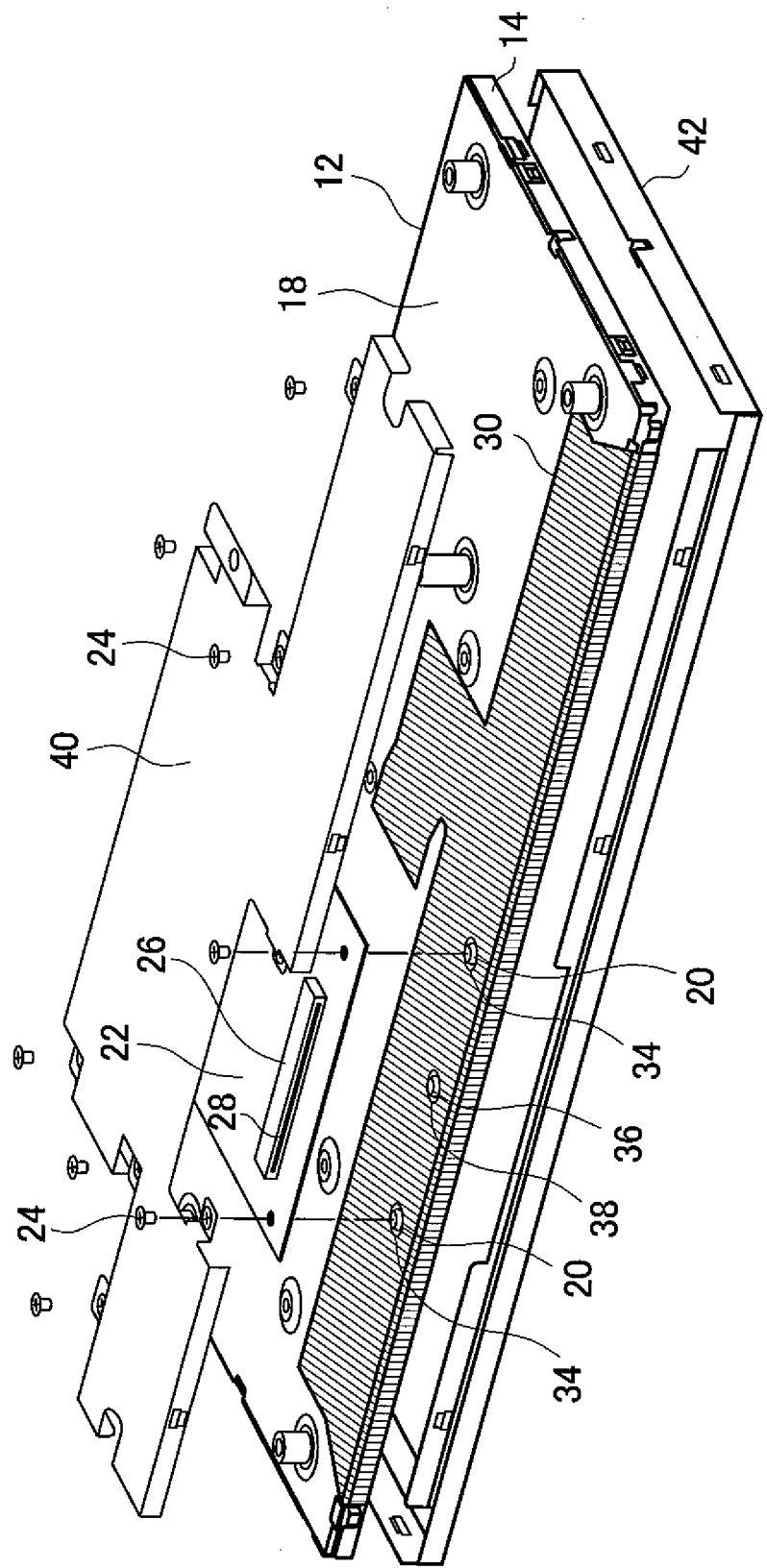
FIG. 3 is an exploded perspective view of the display device according to the embodiment of the invention.
Figure 4:
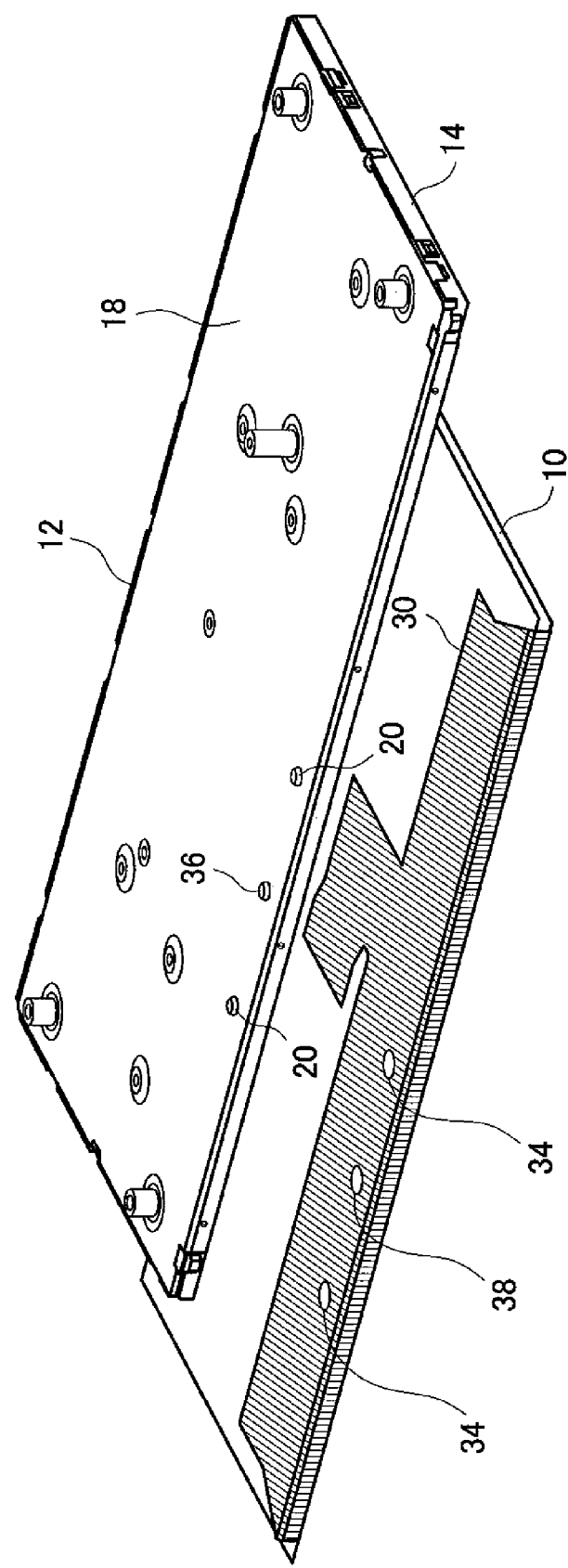
FIG. 4 is an exploded perspective view of a display panel and a case.
Figure 5:
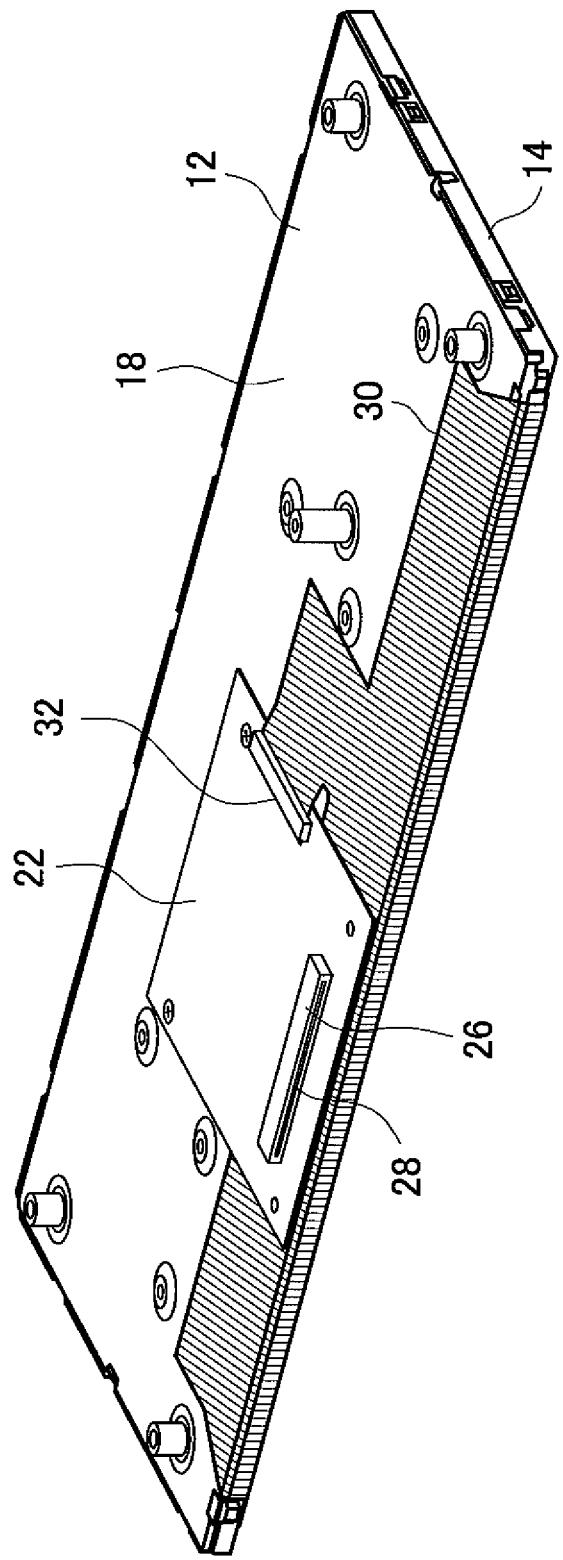
FIG. 5 explains the attachment structure of a circuit board.

FIG. 1 is a front side perspective view of a display device according to the embodiment of the invention. FIG. 2 is a rear side perspective view of the display device according to the embodiment of the invention. FIG. 3 is an exploded perspective view of the display device according to the embodiment of the invention. FIG. 4 is an exploded perspective view of a display panel and a case. FIG. 5 explains the attachment structure of a circuit board.

As shown in FIG. 1, the display device has a display panel 10. Examples of the display panel 10 can include a liquid crystal display panel, an organic electroluminescence display panel, and a plasma display panel. Reference numeral 42 denotes an upper frame. The upper frame 42 has an opening from which a display face 16 of the display panel 10 is exposed, and covers the display panel 10.

With reference to FIG. 2, the configuration of the rear side of the display device according to the invention will be described. The upper frame 42 and a case 12 accommodate the display panel 10 and are combined together. The case 12 has a lower frame 18. A circuit board 22 is disposed on a face of the lower frame 18 on the opposite side from the upper frame 42. Reference numeral 24 denotes screws for fixing the lower frame 18 and the circuit board 22. Reference numeral 26 denotes a first connector disposed on the circuit board 22 for electrically connecting to an external device. Reference numeral 28 denotes a connecting port of the first connector 26. Reference numeral 40 denotes a cover covering a part of the circuit board 22 and a part of a flexible wiring board described later.

With reference to FIG. 3, the configuration shown in FIG. 2 will be described in detail. The case 12 has the lower frame 18 and a middle, frame 14. The middle frame 14 supports the display panel 10. When the display panel is a liquid crystal display panel, a not-shown backlight unit is accommodated between the lower frame 18 and the middle frame 14. The backlight unit includes, for example, a light source formed of cold-cathode tubes (CCFLs) or light-emitting diodes (LEDs), an optical sheet formed of a reflective sheet, a diffuser sheet, and the like, and a light guide plate.

The lower frame 18 has convex portions 20 protruding in the opposite direction to the display panel 10 on the face opposite from the display panel 10. The convex portion 20 can be produced such that, for example, the convex portion 20 is formed by plastically working the lower frame 18, and a concave portion (not shown) is formed on the lower frame 18 on the opposite side from the convex portion 20.

The circuit board 22 includes a circuit for performing display control of the display panel 10. The circuit board 22 is fixed to the lower frame 18 by the convex portions 20 formed on the lower frame 18. For fixing them, the screws 24 can be used. Moreover, the circuit board 22 is fixed to the lower frame 18 at an end of the circuit board 22 (for example, corner portions of the rectangular circuit board 22). That is, the convex portions 20 face the end of the circuit board 22. The convex portions 20 protrude from the lower frame 18 toward the circuit board 22.

As shown in FIG. 3, the connecting port 28 of the first connector 26 opens toward the end of the circuit board 22 closest to the first connector 26. The circuit board 22 is in contact with the convex portions 20 at positions closer to the end than the mounting position of the first connector 26, and is fixed to the lower frame 18.

The display device has a flexible wiring board 30 that electrically connects the display panel 10 with the circuit board 22. The flexible wiring board 30 is turned back from the display panel 10 and extends over the lower frame 18 (refer to FIG. 4). Moreover, the flexible wiring board 30 has a portion disposed on the circuit board 22 on the opposite side from the side where the first connector 26 is mounted. That is, there is a region where the lower frame 18, the flexible wiring board 30, and the circuit board 22 are overlapped with each other in this order. A part of the flexible wiring board 30 is disposed on the circuit board 22 on the side where the first connector 26 is mounted for the connection with the circuit board 22.

As shown in FIGS. 3 and 4, the flexible wiring board 30 has holes 34. The convex portion 20 is inserted into the hole 34 of the flexible wiring board 30 to support the circuit board 22. The circuit board 22 is fixed to the lower frame 18 (the convex portions 20) via the holes 34 of the flexible wiring board 30. The convex portion 20 is formed with a height greater than the thickness of the flexible wiring board 30. Accordingly, a gap is formed at least one of between the circuit board 22 and the flexible wiring board 30 and between the lower frame 18 and the flexible wiring board 30.

The lower frame 18 has a spacer portion 36 in addition to the convex portions 20. Also the spacer portion 36 protrudes from the face opposite from the display panel 10 toward the opposite direction to the display panel 10. Also the spacer portion 36 is formed with a height greater than the thickness of the flexible wiring board 30. The flexible wiring board 30 has a spacer hole 38 in addition to the holes 34. The flexible wiring board 30 is disposed such that the spacer portion 36 is inserted into the spacer hole 38. Therefore, the spacer portion 36 supports (for example, contacts with) the circuit board 22. Different from the convex portion 20, while the spacer portion 36 is in contact with the circuit board 22, the circuit board 22 is not fixed to the lower frame 18 by the spacer portion 36.

With the configuration of the convex portions 20 and the spacer portion 36 described above, the damage to the flexible wiring board 30, which is caused by the deflection of the circuit board 22 when a connecting terminal of an external device is inserted into the connector 26, can be prevented.

Further, the cover 40 covering at least a part of the circuit board 22 and at least a part of the flexible wiring board 30 is attached to the case 12. When the cover 40 is configured of a material that shields the circuit board and the flexible wiring board from electromagnetic wave (for example, a conductor such as metal), the countermeasures against EMI (Electro Magnet Interference) (countermeasures against unnecessary radiation) can be taken.

As shown in FIG. 5, at least apart of the flexible wiring board 30 is disposed between the lower frame 18 of the case 12 and the circuit board 22 (for example, a portion where the first connector 26 is mounted). The connecting port 28 of the first connector 26 is opened at one side of four sides of the display device on the side where the flexible wiring board 30 is turned back. The flexible wiring board 30 is connected to the circuit board 22 while avoiding the front of the connecting port 28 of the first connector 26. A second connector 32 is used for the connection. The second connector 32 is mounted on the circuit board 22 on the opposite side from the lower frame 18. A connecting port (not shown) of the second connector 32 is opened in a direction different from the opening direction of the connecting port 28 of the first connector 26.

According to the embodiment as shown in FIG. 5, since the circuit board 22 and the flexible wiring board 30 are overlapped with each other, the circuit board 22 on which the first connector 26 is mounted and the flexible wiring board 30 can be disposed in a small space. Moreover, since the circuit board 22 and the flexible wiring board 30 can be disposed so as to overlap with each other, the size of the cover 40 can be made small, thereby providing an advantage of reducing the cost of the member. With the configuration of the convex portions 20 and the spacer portion 36 according to the embodiment, the damage to the flexible wiring board 30, which is caused by the deflection of the circuit board 22 when a connecting terminal of an external device is inserted into the connector 26, can be prevented. Especially when, for example, the flexible wiring board 30 is disposed so as to overlap with the portion of the circuit board 22 where the first connector 26 is mounted (that is, at least a part of the flexible wiring board 30 is disposed between the first connector 26 and the lower frame 18) due to the positional relationship between an external device and the display device of the invention, this advantage is remarkable.

The invention is not limited to the above-described embodiment but can be variously modified. For example, the configuration described in the embodiment can be replaced by substantially the same configuration, a configuration providing the same operation and advantage, and a configuration capable of achieving the same object.

What is claimed is:

1. A display device comprising:
    a display panel;
    a lower frame disposed on the display panel on the opposite side from a display face;
    a circuit board disposed on a face of the lower frame on the opposite side from the display panel, the circuit board having a first surface facing to the lower frame and a second surface opposite to the first surface; and
    a flexible wiring board connected to the display panel and the circuit board, wherein
    the flexible wiring board is turned back from the display panel side to the face of the lower frame on the opposite side from the display panel, at least a part of the flexible wiring board being disposed between the lower frame and the circuit board,
    the flexible wiring board has a first part and a second part which overlap with the circuit board, the first part being disposed between the lower frame and the first surface of the circuit board, and the second part being spaced from the first part and being connected to the circuit board, and
    the flexible wiring board has holes therein, and the circuit board is fixed to the lower frame via the holes of the flexible wiring board.

2. The display device according to claim 1, wherein
    the lower frame has convex portions protruding toward the circuit board,
    the convex portions are inserted into the holes of the flexible wiring board to support the circuit board, and
    the circuit board is fixed to the lower frame by the convex portions.

3. The display device according to claim 2, wherein
    a height of at least one of the first convex portion and the second convex portion is greater than a thickness of the flexible wiring board, and
    a gap is formed at least one of between the circuit board and the flexible wiring board and between the lower frame and the flexible wiring board.

4. The display device according to claim 3, wherein
    a connector is mounted on the second surface of the circuit board, and
    the circuit board is fixed to the lower frame at a position between a mounting position of the connector and an end of the circuit board closest to the connector mounting position.

5. The display device according to claim 3, wherein
    a connector is mounted on the second surface of the circuit board, and
    at least the first part of the flexible wiring board is disposed between the connector and the lower frame.

6. The display device according to claim 3, wherein
    a first connector and a second connector are mounted on the second surface of the circuit board on the opposite side from the flexible wiring board,
    the first connector has a connecting port, and
    the second part of the flexible wiring board and the circuit board are connected to each other by the second connector while avoiding the front of the connecting port of the first connector.

7. The display device according to claim 2, wherein
    a connector is mounted on the second surface of the circuit board, and
    the circuit board is fixed to the lower frame at a position between a mounting position of the connector and an end of the circuit board closest to the connector mounting position.

8. The display device according to claim 2, wherein
    a connector is mounted on the second surface of the circuit board, and
    at least the first part of the flexible wiring board is disposed between the connector and the lower frame.

9. The display device according to claim 2, wherein
    a first connector and a second connector are mounted on the second surface of the circuit board,
    the first connector has a connecting port, and
    the second part of the flexible wiring board and the circuit board are connected to each other by the second connector while avoiding the front of the connecting port of the first connector.

10. The display device according to claim 1, wherein
    the lower frame has a first convex portion and a second convex portion protruding toward the circuit board,
    the first convex portion and the second convex portion are inserted into the holes of the flexible wiring board to support the circuit board, and
    the circuit board is fixed to the lower frame by the first convex portion but not fixed thereto by the second convex portion.

11. The display device according to claim 10, wherein
    a height of the first convex portion and a height of the second convex portion are both greater than a thickness of the flexible wiring board, and
    a gap is formed at least one of between the circuit board and the flexible wiring board and between the lower frame and the flexible wiring board.

12. The display device according to claim 11, wherein
    a connector is mounted on the second surface of the circuit board, and
    the circuit board is fixed to the lower frame at a position between a mounting position of the connector and an end of the circuit board closest to the connector mounting position.

13. The display device according to claim 11, wherein
    a connector is mounted on the second surface of the circuit board, and
    at least the first part of the flexible wiring board is disposed between the connector and the lower frame.

14. The display device according to claim 11, wherein
    a first connector and a second connector are mounted on the second surface of the circuit board,
    the first connector has a connecting port, and
    the second part of the flexible wiring board and the circuit board are connected to each other by the second connector while avoiding the front of the connecting port of the first connector.

15. The display device according to claim 10, wherein
a connector is mounted on the second surface of the circuit board on the opposite side from the flexible wiring board, and
the circuit board is fixed to the lower frame at a position between a mounting position of the connector and an end of the circuit board closest to the connector mounting position.

16. The display device according to claim 10, wherein
a connector is mounted on the second surface of the circuit board, and
at least the first part of the flexible wiring board is disposed between the connector and the lower frame.

17. The display device according to claim 10, wherein
a first connector and a second connector are mounted on the second surface of the circuit board,
the first connector has a connecting port, and
the second part of the flexible wiring board and the circuit board are connected to each other by the second connector while avoiding the front of the connecting port of the first connector.

18. The display device according to claim 1, wherein
a connector is mounted on the second surface of the circuit board, and
the circuit board is fixed to the lower frame at a position between a mounting position of the connector and an end of the circuit board closest to the connector mounting position.

19. The display device according to claim 1, wherein
a connector is mounted on the second surface of the circuit board, and
at least the first part of the flexible wiring board is disposed between the connector and the lower frame.

20. The display device according to claim 19, wherein
the connector has a connecting port,
the connecting port faces a predetermined direction, and
the predetermined direction is a direction from a mounting position of the connector toward a portion where the flexible wiring board is turned back.

21. The display device according to claim 1, wherein
a first connector and a second connector are mounted on the second surface of the circuit board,
the first connector has a connecting port,
the second part of the flexible wiring board and the circuit board are connected to each other by the second connector, and
the second part of the flexible wiring board overlaps with the second surface of the circuit board.

* * * * *